US012606931B2

(12) United States Patent
Sumiya et al.

(10) Patent No.: US 12,606,931 B2
(45) Date of Patent: Apr. 21, 2026

(54) SYNTHETIC SINGLE CRYSTAL DIAMOND AND METHOD FOR MANUFACTURING SAME

(71) Applicant: SUMITOMO ELECTRIC INDUSTRIES, LTD., Osaka (JP)

(72) Inventors: Hitoshi Sumiya, Osaka (JP); Jin Hwa Lee, Osaka (JP); Minori Teramoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 624 days.

(21) Appl. No.: 18/009,726

(22) PCT Filed: May 14, 2021

(86) PCT No.: PCT/JP2021/018371
§ 371 (c)(1),
(2) Date: Dec. 11, 2022

(87) PCT Pub. No.: WO2022/004149
PCT Pub. Date: Jan. 6, 2022

(65) Prior Publication Data
US 2023/0220584 A1     Jul. 13, 2023

(30) Foreign Application Priority Data

Jun. 30, 2020     (JP) ................................ 2020-113054

(51) Int. Cl.
*C30B 29/04*     (2006.01)
*B01J 3/06*      (2006.01)
(Continued)

(52) U.S. Cl.
CPC ............... *C30B 29/04* (2013.01); *B01J 3/065* (2013.01); *C30B 9/10* (2013.01); *C30B 33/04* (2013.01); *B01J 2203/0655* (2013.01)

(58) Field of Classification Search
None
See application file for complete search history.

(56) References Cited

U.S. PATENT DOCUMENTS 4,950,625 A     8/1990  Nakashima et al.
9,663,371 B2    5/2017  Ishida et al.
(Continued)

FOREIGN PATENT DOCUMENTS

EP      4067540 A1    10/2022
JP      2-18980 A      1/1990
(Continued)

*Primary Examiner* — Guinever S Gregorio
(74) *Attorney, Agent, or Firm* — Renner, Otto, Boisselle & Sklar, LLP

(57) ABSTRACT

A synthetic single crystal diamond containing 100 ppm or more and 1500 ppm or less of nitrogen atoms, in which the synthetic single crystal diamond contains aggregates each composed of one vacancy and two to four nitrogen atoms present adjacent to the vacancy, a ratio b/a of a length b of a short diagonal line to a length a of a long diagonal line of diagonal lines of a Knoop indentation in a <110> direction in a {001} plane of the synthetic single crystal diamond is 0.08 or less, and the Knoop indentation is formed by measuring Knoop hardness in the <100> direction in the {001} plane of the synthetic single crystal diamond according to JIS Z 2251: 2009 under conditions of a temperature of 23° C.±5° C. and a test load of 4.9 N.

8 Claims, 2 Drawing Sheets

(51) Int. Cl.
     *C30B 9/10*          (2006.01)
     *C30B 33/04*         (2006.01)

(56)                References Cited

U.S. PATENT DOCUMENTS

2020/0283927 A1      9/2020  Sumiya et al.
2020/0325596 A1*  10/2020  Sumiya ..................... C30B 9/10

FOREIGN PATENT DOCUMENTS

JP             2-88498  A      3/1990
WO         2019/077844  A1      4/2019
WO     WO-2019077888  A1 *  4/2019  ............. C30B 33/02

* cited by examiner

SYNTHETIC SINGLE CRYSTAL DIAMOND AND METHOD FOR MANUFACTURING SAME

TECHNICAL FIELD

The present disclosure relates to a synthetic single crystal diamond and a method for manufacturing the same. The present application claims a priority based on Japanese Patent Application No. 2020-113054 filed on Jun. 30, 2020, the entire content of which is incorporated herein by reference.

BACKGROUND ART

Since single crystal diamond has high hardness, it has been widely used in tools such as cutting tools, grinding tools, and anti-wear tools. Single crystal diamond used in tools includes natural diamond and synthetic diamond.

Most of the natural diamonds (type Ia diamond) contain aggregated nitrogen atoms as impurities. Aggregated nitrogen atoms in the diamond crystal can inhibit the plastic deformation and/or the development of cracks when the diamond is used in a tool. Therefore, natural diamond has high mechanical strength. However, since natural diamond varies greatly in quality and the supply thereof is not stable, there is a limit in using natural diamond in the industrial field.

On the contrary, synthetic diamond is constant in quality and may be supplied stably, and thereby is widely used in the industrial field.

Generally, synthetic diamond (type Ib diamond) contains isolated substitutional nitrogen atoms as impurities. There is a tendency that the mechanical properties of diamond will deteriorate as the concentration of isolated substitutional nitrogen atoms in diamond crystals increases. Therefore, when type Ib synthetic diamond is used in a tool, there is a tendency that the cutting edge thereof is likely to be worn or breakage.

Further, some synthetic diamonds (type IIa diamond) contain almost no nitrogen impurities. Since type IIa synthetic diamond does not contain impurities or crystal defects that inhibit the progress of cracks, when it is used in a tool, there is a tendency that the cutting edge of the tool is likely to be breakage.

Therefore, studies have been carried out on techniques for improving wear resistance and breakage resistance in synthetic diamonds.

For example, Patent Literature 1 (WO 2019/077888) discloses synthetic single crystal diamond having high hardness and excellent breakage resistance.

CITATION LIST

Patent Literature

Patent Literature 1: WO 2019/077888

SUMMARY OF INVENTION

A synthetic single crystal diamond of the present disclosure is a synthetic single crystal diamond containing 100 ppm or more and 1500 ppm or less of nitrogen atoms, wherein the synthetic single crystal diamond contains aggregates each composed of one vacancy and two to four nitrogen atoms present adjacent to the vacancy, wherein a ratio b/a of a length b of a short diagonal line to a length a of a long diagonal line of diagonal lines of a Knoop indentation in a <110> direction in a {001} plane of the synthetic single crystal diamond is 0.08 or less, and wherein the Knoop indentation is formed by measuring Knoop hardness in the <100> direction in the {001} plane of the synthetic single crystal diamond according to JIS Z 2251: 2009 under conditions of a temperature of 23° C.±5° C. and a test load of 4.9 N.

A method for manufacturing the synthetic single crystal diamond is a method for manufacturing the synthetic single crystal diamond described above, the method comprising:

a first step of synthesizing a diamond single crystal containing nitrogen atoms at a concentration of 100 ppm or more and 1500 ppm or less based on atom numbers by a temperature difference process using a solvent metal;

a second step of irradiating the diamond single crystal with one or both of an electron beam and a particle beam with an energy of 100 MGy or more and 1000 MGy or less; and a third step of obtaining a synthetic single crystal diamond by applying a pressure of 5 GPa or more and a temperature of 2300° C. or more and 2600° C. or less for one minute or more and 3600 minutes or less to the diamond single crystal after the second step.

DETAILED DESCRIPTION

Figure 1:
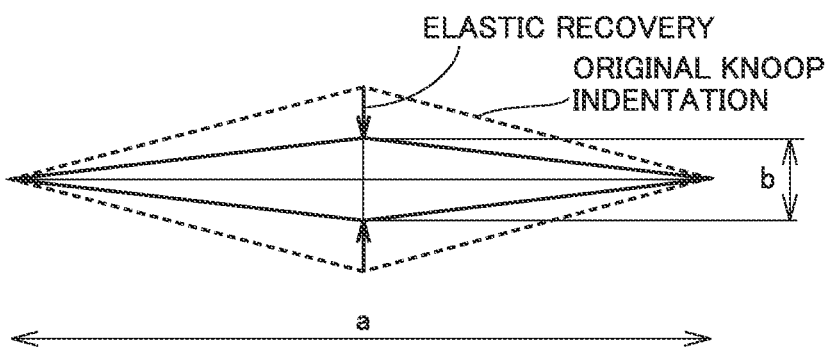
FIG. 1 is a view for describing a Knoop indentation.

Problem to be Solved by the Present Disclosure

Due to a recent demand for long lives of tools, a synthetic single crystal diamond being excellent in terms of wear resistance and breakage resistance is in demand.

Therefore, an objective of the present disclosure is to provide a synthetic single crystal diamond having high hardness, a large elastic recovery rate and excellent breakage resistance.

Advantageous Effect of the Present Disclosure

According to the present disclosure, it becomes possible to provide a synthetic single crystal diamond having high hardness, a large elastic recovery rate and excellent breakage resistance.

DESCRIPTION OF EMBODIMENTS

First, a description will be given on each embodiment of the present disclosure.

(1) A synthetic single crystal diamond of the present disclosure is a synthetic single crystal diamond containing 100 ppm or more and 1500 ppm or less of nitrogen atoms, in which the synthetic single crystal diamond contains aggregates each composed of one vacancy and two to four nitrogen atoms present adjacent to the vacancy, a ratio b/a of a length b of a short diagonal line to a length a of a long diagonal line of diagonal lines of a Knoop indentation in a <110> direction in a {001} plane of the synthetic single crystal diamond is 0.08 or less, and the Knoop indentation is formed by measuring Knoop hardness in the <100> direction in the {001} plane of the synthetic single crystal diamond according to JIS Z 2251: 2009 under conditions of a temperature of 23° C.±5° C. and a test load of 4.9 N.

The synthetic single crystal diamond of the present disclosure has high hardness, a large elastic recovery rate and excellent breakage resistance.

(2) In an infrared absorption spectrum of the synthetic single crystal diamond, an absorption peak is preferably present in the wave number range of $1175\pm2$ $cm^{-1}$.

In such a case, the synthetic single crystal diamond may have high hardness, a large elastic recovery rate and excellent breakage resistance.

(3) In a fluorescent spectrum of the synthetic single crystal diamond, a luminescence peak is preferably present in one or both of the fluorescence wavelength range of $503\pm2$ nm and the fluorescence wavelength range of 510 nm or more and 530 nm or less.

In such a case, the synthetic single crystal diamond may have high hardness, a large elastic recovery rate and excellent breakage resistance.

(4) In a fluorescent spectrum of the synthetic single crystal diamond, a luminescence peak is preferably present in one or both of the fluorescence wavelength range of $415\pm2$ nm and the fluorescence wavelength range of 420 nm or more and 470 nm or less.

In such a case, the synthetic single crystal diamond may have high hardness, a large elastic recovery rate and excellent breakage resistance.

(5) In an infrared absorption spectrum of the synthetic single crystal diamond, an absorption peak is preferably present in the wave number range of $1282\pm2$ $cm^{-1}$.

In such a case, the synthetic single crystal diamond may have high hardness, a large elastic recovery rate and excellent breakage resistance.

(6) In an infrared absorption spectrum of the synthetic single crystal diamond, an absorption peak is preferably present in the wave number range of $1370$ $cm^{-1}$ or more and $1385$ $cm^{-1}$ or less.

In such a case, the synthetic single crystal diamond may have high hardness, a large elastic recovery rate and excellent breakage resistance.

(7) The Knoop hardness in the <100> direction in the {001} plane of the synthetic single crystal diamond is preferably 100 GPa or more.

In such a case, the synthetic single crystal diamond may have excellent wear resistance.

(8) In a breaking strength test in which a spherical diamond indenter having a tip radius of 50 μm is pressed against a surface of the synthetic single crystal diamond at a loading speed of 100 N/min, a cracking load is preferably 17 N or more.

In such a case, the synthetic single crystal diamond may have excellent breakage resistance.

(9) A method for manufacturing a synthetic single crystal diamond of the present disclosure is a method for manufacturing a synthetic single crystal diamond described above, the method including:

a first step of synthesizing a diamond single crystal containing nitrogen atoms at a concentration of 100 ppm or more and 1500 ppm or less based on atom numbers by a temperature difference process using a solvent metal;

a second step of irradiating the diamond single crystal with one or both of an electron beam and a particle beam with an energy of 100 MGy or more and 1000 MGy or less; and a third step of obtaining a synthetic single crystal diamond by applying a pressure of 5 GPa or more and a temperature of 2300° C. or more and 2600° C. or less for one minute or more and 3600 minutes or less to the diamond single crystal after the second step.

In such a case, it is possible to obtain a synthetic single crystal diamond having high hardness, a large elastic recovery rate and excellent breakage resistance.

Details of Embodiments of the Present Disclosure

<Form of Existence of Nitrogen Atoms in Diamond Crystal>

First, in order to deepen the understanding of the synthetic single crystal diamond of the present disclosure, nitrogen atoms that exist as an impurity in a crystal, which is one of the main factors that determine the performance of diamond will be described.

Nitrogen atoms in a diamond crystal may be classified into isolated substitutional nitrogen atoms, aggregated nitrogen atoms and the like, depending on the form of existence.

Isolated substitutional nitrogen atoms (C center) refer to those atoms that each replaces a carbon atom in a diamond crystal and exists at the position of the carbon atom as an atomic unit.

The present inventors newly assumed that, when isolated substitutional nitrogen atoms are contained in a diamond crystal, local tensile stress is generated in the crystal lattices around the crystal, these act as starting points of plastic deformation or breaking, the hardness decreases and the wear resistance or the breakage resistance deteriorates.

A synthetic single crystal diamond containing isolated substitutional nitrogen atoms shows an absorption peak near the wave number of 1130 $cm^{-1}$ (i.e., the wave number of $1130\pm2$ $cm^{-1}$) in the infrared absorption spectrum measured by Fourier transform infrared spectroscopy.

In a synthetic single crystal diamond containing isolated substituted nitrogen atoms, the nitrogen atoms exist as unpaired electrons, and thereby, the concentration of isolated substituted nitrogen atoms may be measured by ESR (Electron Spin Resonance) analysis. In addition to isolated substitutional nitrogen atoms, the ESR analysis may also detect signals such as crystal defects containing unpaired electrons. In this case, isolated substitutional nitrogen atoms may be identified separately by its g value or its signal relaxation time.

Aggregated nitrogen atoms refer to those atoms that are present in a diamond crystal in an aggregate of two or more nitrogen atoms.

The present inventors newly assumed that aggregated nitrogen atoms in the diamond crystal may suppress plastic deformation or the progress of cracks that is caused when a load is applied to the diamond crystal. The present inventors newly assumed that, when the diamond crystal contains aggregated nitrogen atoms, the hardness of the diamond crystal becomes high, the elastic deformability becomes large and the breakage resistance improves.

The aggregated nitrogen atoms exist in an A center (2-nitrogen atom pairs), an H3 center (2-nitrogen atom aggregates), an N3 center (3-nitrogen atom aggregates), a B center (4-nitrogen atom aggregates), a B' center (platelets) and the like.

The A center (2-nitrogen atom pairs) is an aggregate composed of two nitrogen atoms, and the two nitrogen atoms covalently bond to each other, and each nitrogen atom substitutes for a carbon atom that configures the diamond crystal. A diamond containing the A center (2-nitrogen atom pairs) is called type IaA diamond. A synthetic single crystal diamond containing the A center (2-nitrogen atom pairs) shows an absorption peak near the wave number of 1282 $cm^{-1}$ (i.e., the wave number of $1282\pm2$ $cm^{-1}$) in the infrared absorption spectrum measured by Fourier transform infrared spectroscopy.

The H3 center (2-nitrogen atom aggregates) is an aggregate composed of one vacancy and two nitrogen atoms present adjacent to the vacancy, and each nitrogen atom substitutes for a carbon atom that configures the diamond crystal. In the present specification, "nitrogen atom present adjacent to a vacancy" means a nitrogen atom having the shortest interatomic distance from a carbon atom when the carbon atom is assumed to be present at the position of the vacancy (i.e., nearest neighbor). This is also true for the N3 center and the B center to be described below.

In a fluorescent spectrum obtained by irradiating the synthetic single crystal diamond containing the H3 center (2-nitrogen atom aggregates) with excitation light that is shorter than approximately 500 nm, for example, excitation light having the wavelength of 325 nm, a luminescence peak is present in one or both of near the fluorescence wavelength of 503 nm (i.e., the fluorescence wavelength of $503\pm2$ nm) and the fluorescence wavelength range of 510 nm or more and 530 nm or less.

The N3 center (3-nitrogen atom aggregates) is an aggregate composed of one vacancy and three nitrogen atoms present adjacent to the vacancy, and each nitrogen atom substitutes for a carbon atom that configures the diamond crystal.

In a fluorescent spectrum obtained by irradiating the synthetic single crystal diamond containing the N3 center (3-nitrogen atom aggregates) with excitation light that is shorter than approximately 410 nm, for example, excitation light having the wavelength of 325 nm, a luminescence peak is present in one or both of near the fluorescence wavelength of 415 nm (i.e., the fluorescence wavelength of $415\pm2$ nm) and the fluorescence wavelength range of 420 nm or more and 470 nm or less.

The B center (4-nitrogen atom aggregates) is an aggregate composed of one vacancy and four nitrogen atoms present adjacent to the vacancy, and each nitrogen atom substitutes for a carbon atom that configures the diamond crystal.

A diamond containing the B center (4-nitrogen atom aggregates) is called type IaB diamond. A synthetic single crystal diamond containing 4-nitrogen atom aggregates shows an absorption peak near the wave number of 1175 $cm^{-1}$ (i.e., the wave number of $1175\pm2$ $cm^{-1}$) in the infrared absorption spectrum measured by Fourier transform infrared spectroscopy.

The B' center (also called platelets) is a plate-like aggregate composed of five or more nitrogen atoms and interstitial carbon and is incorporated into the crystal as an inclusion.

A diamond containing the B' center (platelets) is called type IaB' diamond. A synthetic single crystal diamond containing the B' center (platelets) shows an absorption peak at the wave number of 1358 $cm^{-1}$ or more and 1385 $cm^{-1}$ or less in the infrared absorption spectrum measured by Fourier transform infrared spectroscopy.

As a result of intensive studies of the aggregated nitrogen atoms that can improve the characteristics of the synthetic single crystal diamond, the present inventors newly found that the B center, the H3 center and the N3 center include a small amount of crystal strain and have a stable structure. In addition, the present inventors newly found that, when at least any of the B center, the H3 center and the N3 center is formed in the synthetic single crystal diamond, it is possible to further improve the mechanical characteristics such as hardness, elastic deformability and breakage resistance of the synthetic single crystal diamond and completed the present disclosure.

Hereinafter, specific examples of the synthetic single crystal diamond of the present disclosure and a method for manufacturing the same will be described with reference to the drawings. In the drawings of the present disclosure, the same reference sign indicates the same portions or equivalent portions. Further, dimensional relationships of lengths, widths, thicknesses, depths and the like have been modified as appropriate in order for the clarification and simplification of the drawings and do not necessarily indicate actual dimensional relationships.

In the present specification, the expression "A to B" represents the range of upper to lower limits (i.e., A or more and B or less). When no unit is indicated for A and a unit is indicated only for B, the unit of A is the same as the unit of B.

In the present specification, a generic plane orientation including any crystallographically equivalent plane orientation is indicated by { }, and a generic direction including any crystallographically equivalent direction is indicated by < >.

Embodiment 1: Synthetic Single Crystal Diamond

A synthetic single crystal diamond of the present embodiment is a synthetic single crystal diamond containing 100 ppm or more and 1500 ppm or less of nitrogen atoms, in which the synthetic single crystal diamond contains aggregates each composed of one vacancy and two to four nitrogen atoms present adjacent to the vacancy, a ratio b/a of a length b of a short diagonal line to a length a of a long diagonal line of diagonal lines of a Knoop indentation in a <110> direction in a {001} plane of the synthetic single crystal diamond is 0.08 or less, and the Knoop indentation is formed by measuring Knoop hardness in the <100> direction in the {001} plane of the synthetic single crystal diamond according to JIS Z 2251: 2009 under condition of a temperature of 23° C.±5° C. and a test load of 4.9 N.

The synthetic single crystal diamond of the present embodiment has high hardness, a large elastic recovery rate and excellent breakage resistance. The reason therefor is not clear, but is assumed as described in the following (i) to (iii).

(i) The synthetic single crystal diamond of the present embodiment contains nitrogen atoms at a concentration of 100 ppm or more and 1500 ppm or less based on atom numbers. In such a case, the nitrogen atoms in the synthetic single crystal diamond are likely to aggregate. Therefore, the synthetic single crystal diamond is likely to contain aggregated nitrogen atoms, has large elastic deformability and improves in breakage resistance.

(ii) The synthetic single crystal diamond contains aggregates each composed of one vacancy and two to four nitrogen atoms present adjacent to the vacancy. Therefore, the synthetic single crystal diamond has high hardness and large elastic deformability and improves in breakage resistance.

(iii) In the synthetic single crystal diamond of the present embodiment, the ratio b/a of the diagonal lines of a Knoop indentation is 0.08 or less. Therefore, the synthetic single crystal diamond has large elastic deformability. The relationship between the Knoop indentation and the elastic deformability will be described below.

<Nitrogen Atomic Concentration>

The synthetic single crystal diamond of the present embodiment contains nitrogen atoms at a concentration of 100 ppm or more and 1500 ppm or less based on atom numbers (hereinafter, also referred to as "nitrogen atomic concentration"). When the nitrogen atomic concentration is 100 ppm or more, the nitrogen atoms in the synthetic single crystal diamond are likely to form aggregated nitrogen atoms. When the nitrogen atomic concentration is 1500 ppm or less, the synthetic single crystal diamond may have high hardness and excellent breakage resistance.

The lower limit of the nitrogen atomic concentration in the synthetic single crystal diamond may be adjusted to 100 ppm or more, 200 ppm or more or 300 ppm or more. The upper limit of the nitrogen atomic concentration in the synthetic single crystal diamond may be adjusted to 1500 ppm or less, 1400 ppm or less or 1300 ppm or less. The nitrogen atomic concentration in the synthetic single crystal diamond may be adjusted to 100 ppm or more and 1500 ppm or less, 100 ppm or more and 1400 ppm or less, 100 ppm or more and 1300 ppm or less, 200 ppm or more and 1500 ppm or less, 200 ppm or more and 1400 ppm or less, 200 ppm or more and 1300 ppm or less, 300 ppm or more and 1500 ppm or less, 300 ppm or more and 1400 ppm or less and 300 ppm or more and 1300 ppm or less.

The nitrogen atomic concentration in the synthetic single crystal diamond may be measured by secondary ion mass spectrometry (SIMS).

<Aggregated Nitrogen Atoms>

The synthetic single crystal diamond of the present embodiment contains aggregates each composed of one vacancy and two to four nitrogen atoms present adjacent to the vacancy. As the aggregate composed of one vacancy and two nitrogen atoms present adjacent to the vacancy, the H3 center (2-nitrogen atom aggregates) is exemplified. As the aggregate composed of one vacancy and three nitrogen atoms present adjacent to the vacancy, the N3 center (3-nitrogen atom aggregates) is exemplified. As the aggregate composed of one vacancy and four nitrogen atoms present adjacent to the vacancy, the B center (4-nitrogen atom aggregates) is exemplified.

The B center, the H3 center and the N3 center include a small amount of crystal strain and have a stable structure. The synthetic single crystal diamond of the present embodiment contains at least any of the B center, the H3 center and the N3 center and thus has high hardness, large elastic deformability and excellent breakage resistance.

(B Center)

The synthetic single crystal diamond of the present embodiment preferably contains aggregates each composed of one vacancy and four nitrogen atoms present adjacent to the vacancy (B center (4-nitrogen atom aggregates)). Whether or not the synthetic single crystal diamond contains the B center may be confirmed from the infrared absorption spectrum measured by Fourier transform infrared spectroscopy. Specifically, when an absorption peak is present near the wave number of 1175 $cm^{-1}$ (i.e., the wave number of 1175±2 $cm^{-1}$) in the infrared absorption spectrum, the synthetic single crystal diamond is determined to contain the B center.

(H3 Center)

The synthetic single crystal diamond of the present embodiment preferably contains aggregates each composed of one vacancy and two nitrogen atoms present adjacent to the vacancy (H3 center (2-nitrogen atom aggregates)). Whether or not the synthetic single crystal diamond contains the H3 center may be confirmed from the fluorescent spectrum obtained by irradiating the synthetic single crystal diamond with excitation light having the wavelength of 325 nm. Specifically, in a fluorescent spectrum obtained by irradiating the synthetic single crystal diamond with excitation light having the wavelength of 325 nm, when a luminescence peak is present in one or both of the fluorescence wavelength range of 503±2 nm and the fluorescence wavelength range of 510 nm or more and 530 nm or less, the synthetic single crystal diamond is determined to contain the H3 center.

The peak in the fluorescence wavelength range of 503±2 nm is a luminescence peak corresponding to the zero-phonon line of the H3 center, and the luminescence peak in the fluorescence wavelength range of 510 nm or more and 530 nm or less is a luminescence peak corresponding to the subband (phonon side band) of the H3 center. The luminescence peak in the fluorescence wavelength range of 510 nm or more and 530 nm or less is observed as one or more mountain-like peaks in the range. At least one of the mountain-like peaks indicates the maximum intensity in the range.

(N3 Center)

The synthetic single crystal diamond of the present embodiment preferably contains aggregates each composed of one vacancy and three nitrogen atoms present adjacent to the vacancy (N3 center (3-nitrogen atom aggregates)). Whether or not the synthetic single crystal diamond contains the N3 center may be confirmed from the fluorescent spectrum obtained by irradiating the synthetic single crystal diamond with excitation light having the wavelength of 325 nm. Specifically, in a fluorescent spectrum obtained by irradiating the synthetic single crystal diamond with excitation light having the wavelength of 325 nm, when a luminescence peak is present in one or both of the fluorescence wavelength range of 415±2 nm and the fluorescence wavelength range of 420 nm or more and 470 nm or less, the synthetic single crystal diamond is determined to contain the N3 center.

The peak in the fluorescence wavelength range of 415±2 nm is a luminescence peak corresponding to the zero-phonon line of the N3 center, and the luminescence peak in the fluorescence wavelength range of 420 nm or more and 470 nm or less is a luminescence peak corresponding to the subband (phonon side band) of the N3 center. The luminescence peak in the fluorescence wavelength range of 420 nm or more and 470 nm or less is observed as one or more mountain-like peaks in the range. At least one of the mountain-like peaks indicates the maximum intensity in the range.

(A Center (2-Nitrogen Atom Pairs))

The synthetic single crystal diamond of the present embodiment preferably contains the A center (2-nitrogen atom pairs). The A center in the synthetic single crystal diamond can suppress the propagation of cracks. Therefore, the synthetic single crystal diamond may have excellent breakage resistance.

Whether or not the synthetic single crystal diamond contains the A center may be confirmed from the infrared absorption spectrum measured by Fourier transform infrared spectroscopy. Specifically, when an absorption peak is present near the wave number of 1282 $cm^{-1}$ (i.e., the wave number of 1282±2 $cm^{-1}$) in the infrared absorption spectrum, the synthetic single crystal diamond is determined to contain the A center.

(B' Center (Platelets))

In the synthetic single crystal diamond of the present embodiment, in the infrared absorption spectrum, an absorption peak is preferably present in the wave number range of 1370 cm$^{-1}$ or more and 1385 cm$^{-1}$ or less. The absorption peak is derived from the B' center (platelets) in the synthetic single crystal diamond.

When an absorption peak is present in the wave number range of 1370 cm$^{-1}$ or more and 1385 cm$^{-1}$ or less in the infrared absorption spectrum of the synthetic single crystal diamond, the aggregate of the nitrogen atoms that are contained in the B' center (platelets) has an moderate size, may inhibit plastic deformation or the progress of cracks and is unlikely to act as a starting point of breaking. Therefore, the synthetic single crystal diamond may have high hardness and excellent strength.

Generally, the synthetic single crystal diamond containing the B' center (platelets) shows an absorption peak at the wave number of 1358 cm$^{-1}$ or more and 1385 cm$^{-1}$ or less in the infrared absorption spectrum. However, when an absorption peak is present in the range smaller than the wave number of 1370 cm$^{-1}$ (the wave number of 1358 cm$^{-1}$ or more and less than 1370 cm$^{-1}$), the B' center (platelets) aggregate in the crystal is too large and acts as a starting point of breaking, which is not preferable. Therefore, in the infrared absorption spectrum of the synthetic single crystal diamond, an absorption peak is preferably not present in the wave number range of 1358 cm$^{-1}$ or more and less than 1370 cm$^{-1}$.

(Other Aggregated Nitrogen Atoms)

Aggregated nitrogen atoms other than the H3 center, the N3 center, the B center and the B' center do not greatly affect the mechanical properties of the synthetic single crystal diamond. Therefore, the synthetic single crystal diamond of the present embodiment may contain aggregated nitrogen atoms other than the H3 center, the N3 center, the B center and the B' center.

<Isolated Substitutional Nitrogen Atoms>

The synthetic single crystal diamond of the present embodiment preferably does not contain the isolated substitutional nitrogen atoms (C center). In such a case, the synthetic single crystal diamond of the present embodiment may have high hardness and excellent breakage resistance.

Whether or not the synthetic single crystal diamond contains isolated substitutional nitrogen atoms may be determined from the infrared absorption spectrum measured by Fourier transform infrared spectroscopy. Single crystal diamond containing isolated substitutional nitrogen atoms shows a peak near the wave number of 1130 cm$^{-1}$ (i.e., wave number of 1130±2 cm$^{-1}$) in the infrared absorption spectrum measured by Fourier transform infrared spectroscopy. Therefore, it may be determined that the synthetic single crystal diamond does not contain isolated substitutional nitrogen atoms by confirming that an absorption peak derived from isolated substitutional nitrogen atoms is absent in the wave number range of 1130±2 cm$^{-1}$ in the infrared absorption spectrum of the synthetic single crystal diamond.

In the infrared absorption spectrum, if there is a shoulder of the absorption peak of the aggregated nitrogen atoms other than the isolated substitutional nitrogen atoms in the wave number range of 1130±2 cm$^{-1}$ and it is unclear whether the shoulder is an absorption peak derived from isolated substitutional nitrogen atoms, the presence or absence of isolated substitutional nitrogen atoms may be determined by the ESR analysis. When there is no isolated substitutional nitrogen atom in the synthetic single crystal diamond, there are no unpaired electrons in the synthetic single crystal diamond. Therefore, when the ESR analysis is performed, no signal is detected from the synthetic single crystal diamond. As a result, it may be confirmed that there is no isolated substitutional nitrogen atom in the synthetic single crystal diamond.

<Infrared Absorption Spectrum>

When the C center, the A center, the B center and the B' center (platelets) are present in the diamond crystal, in the infrared absorption spectrum of the diamond crystal measured by Fourier transform infrared spectroscopy, an absorption peak derived from each center is observed. Since the waveform of each center overlaps the waveform of another center, the presence or absence or amount of each center may not be specified only from the intensity value at each wave number. On the other hand, the determination of the presence or absence of each center and the qualitative evaluation of the content ratio of each center are possible by considering the approximate waveform of each center from the relative comparison of the intensities of individual wave numbers.

<Ratio b/a of Diagonal Line of Knoop Indentation>

The ratio b/a of the length b of the short diagonal line to the length a of the long diagonal line of the diagonal lines of a Knoop indentation in the <110> direction in the {001} plane of the synthetic single crystal diamond of the present embodiment is 0.08 or less, and the Knoop indentation is formed by measuring Knoop hardness in the <100> direction in the {001} plane of the synthetic single crystal diamond according to JIS Z 2251: 2009 under condition of the temperature of 23° C.±5° C. and the test load of 4.9 N.

The measurement of the Knoop hardness is well known as one of the criteria indicating the hardness of industrial materials as specified in JIS Z2251: 2009 and is measurement in which the hardness of a material to be measured is determined by pressing the Knoop indenter against the material at a predetermined temperature and a predetermined load (test load).

Here, the Knoop indenter is a diamond indenter having a rhombic quadrangular prism shape on the bottom surface. In addition, in the rhombic shape of the bottom surface, the ratio b'/a' of the length b' of the short diagonal line to the length a' of the long diagonal line of the diagonal lines is specified to be 0.141. In addition, the Knoop indentation refers to a mark remaining at a site from which the Knoop indenter has been released immediately after the Knoop indenter has been pressed against the material to be measured (the synthetic single crystal diamond in the present embodiment) at the above-described temperature and the above-described test load. In the present embodiment, an indentation (Knoop indentation) is made in the <100> direction in the {001} plane of the synthetic single crystal diamond according to JIS Z 2251: 2009 under conditions of a temperature of 23° C.±5° C. and a test load of 4.9 N.

One of the features of the synthetic single crystal diamond of the present embodiment is that the ratio b/a of the diagonal lines of the Knoop indentation is 0.08 or less and becomes smaller than the ratio b'/a' (0.141) of the original Knoop indentation. This is because the material to be measured (the synthetic single crystal diamond in the present embodiment) behaves elastically and recovery (elastic recovery) in which the indentation attempts to elastically return to the origin occurs.

The above-described phenomenon will be described using FIG. 1 that schematically illustrates the Knoop indentation. For example, when the material to be measured exhibits no elastic recovery, the cross section of the Knoop indenter and the Knoop indentation become the same shape (a portion indicated as "original Knoop indentation" in FIG. 1). On the other hand, in the synthetic single crystal diamond of the present embodiment, since elastic deformation is likely to occur in the direction of the arrow in the drawing, the Knoop indentation becomes a rhombic shape indicated by the solid line in the drawing. That is, as the return in the direction of the arrow in the drawing becomes larger, the value of the ratio b/a becomes smaller. This indicates that, as the value of the ratio b/a becomes smaller, the elastic deformability becomes larger.

The synthetic single crystal diamond of the present embodiment has a ratio b/a of the diagonal lines of the Knoop indentation being 0.08 or less and thus has large elastic deformability. As elastic deformation becomes larger, the toughness becomes larger and thus the synthetic single crystal diamond becomes tougher.

The upper limit of the ratio b/a of the diagonal lines of the Knoop indentation is 0.08 or less and may be adjusted to 0.075 or less, 0.07 or less, 0.065 or less or 0.06 or less. Since the ratio b/a of the diagonal lines of the Knoop indentation becomes smaller, the elastic deformability becomes larger, there is no need to particularly limit the lower limit. Sometimes no plastic deformation or breaking occurs, b/a becomes zero in this case, and the Knoop indentation becomes only a line in the direction of the long diagonal line. Therefore, the lower limit of the ratio b/a of the diagonal lines of the Knoop indentation may be adjusted to 0 or more. The ratio b/a of the diagonal lines of the Knoop indentation may be adjusted to 0 or more and 0.08 or less, 0 or more and 0.075 or less, 0 or more and 0.07 or less, 0 or more and 0.065 or less or 0 or more and 0.06 or less.

<Knoop Hardness>

The Knoop hardness of the synthetic single crystal diamond according to the present embodiment in the <100> direction in the {001} plane (hereinafter, also referred to as the {001}<100> Knoop hardness) is preferably 100 GPa or more. A synthetic single crystal diamond having a {001}<100> Knoop hardness of 100 GPa or more has higher hardness and excellent wear resistance than natural diamond containing nitrogen.

The lower limit of the {001}<100> Knoop hardness of the synthetic single crystal diamond may be adjusted to 105 GPa or more, 110 GPa or more or 115 GPa or more. The upper limit of the {001}<100> Knoop hardness of the synthetic single crystal diamond is not particularly limited but may be adjusted to, for example, 150 GPa or less from the production viewpoint. The {001}<100> Knoop hardness of the synthetic single crystal diamond may be adjusted to 100 GPa or more and 150 GPa or less, 105 GPa or more and 150 GPa or less, 110 GPa or more and 150 GPa or less or 115 GPa or more and 150 GPa or less.

A method of evaluating the {001}<100> Knoop hardness of the synthetic single crystal diamond (hereinafter, also referred to as HK having a unit of GPa) will be described. First, an indentation is made in the <100> direction in the {001} plane of the synthetic single crystal diamond according to JIS Z 2251: 2009 under conditions of a temperature of 23° C.±5° C. and a test load of 4.9 N. The long diagonal line "a" (μm) of the obtained indentation is measured, and the Knoop hardness (HK) is calculated by the following expression A.

$$HK = 14229 \times 4.9/a^2 \qquad \text{Expression A}$$

<Cracking Load>

Preferably, the synthetic single crystal diamond of the present embodiment has a cracking load of 15 N or more in a breaking strength test in which a spherical diamond indenter having a tip radius (R) of 50 μm is pressed against a surface of the synthetic single crystal diamond at a loading speed of 100 N/min. When the cracking load is 15 N or more, the synthetic single crystal diamond has excellent breaking strength and breakage resistance, and when it is used as a material in a cutting tool, the breakage of the cutting edge is unlikely to occur.

The lower limit of the cracking load of the synthetic single crystal diamond may be adjusted to 17 N or more, 20 N or more, 25 N or more or 30 N or more. The upper limit of the cracking load is not particularly limited, but from the viewpoint of production, it is, for example, 50 N or less. The cracking load of the synthetic single crystal diamond may be adjusted to 15 N or more and 50 N or less, 17 N or more and 50 N or less, 20 N or more and 50 N or less, 25 N or more and 50 N or less or 30 N or more and 50 N or less.

The breaking strength test is performed under the following conditions. A spherical diamond indenter with a tip radius (R) of 50 μm is pressed against the sample, a load is applied to the sample at a loading speed of 100 N/min, and the load at the moment when a crack occurs in the sample (cracking load) is measured. The moment when a crack occurs is measured using an AE sensor. The larger the cracking load, the higher the strength of the sample and the better the breakage resistance.

When an indenter with a tip radius (R) smaller than 50 μm is used as the measuring indenter, the sample is plastically deformed before a crack is generated, and the strength against cracks may not be measured accurately. On the contrary, an indenter with a tip radius (R) larger than 50 μm may be used to perform the measurement, but in this case, a greater load is required until a crack occurs and the contact area between the indenter and the sample increases, which may affect the measurement accuracy due to the surface accuracy of the sample and may greatly affect the crystal orientation of the crystal. Therefore, it is preferable to use an indenter with a tip radius (R) of 50 μm in the breaking strength test for a synthetic single crystal diamond.

<Applications>

The synthetic single crystal diamond of the present embodiment can be used in cutting tools such as precision cutting tools or woodworking cutters and wear-resistant tools such as dressers for grinding wheels, wire drawing dies, scribing tools, water jet orifices, and wire guides, additionally, tools in a wide range of applications.

Embodiment 2: Method of Producing Synthetic Single Crystal Diamond

An example of a method of producing the synthetic single crystal diamond of Embodiment 1 will be described below. The synthetic single crystal diamond of Embodiment 1 is not limited to a synthetic single crystal diamond produced by the following manufacturing method and may be a synthetic single crystal diamond produced by a different manufacturing method.

A method for manufacturing a synthetic single crystal diamond of the present disclosure is a method for manufacturing the synthetic single crystal diamond of Embodiment 1 and includes: a first step of synthesizing a diamond single crystal containing nitrogen atoms at a concentration of 100 ppm or more and 1500 ppm or less based on atom numbers by a temperature difference process using a solvent metal (hereinafter also referred to as a first step); a second step of irradiating the diamond single crystal with one or both of an electron beam and a particle beam with an energy of 100 MGy or more and 1000 MGy or less (hereinafter also referred to as a second step); and a third step of obtaining a synthesis single crystal diamond by applying a pressure of 5

GPa or more and a temperature of 2300° C. or more and 2600° C. or less for one minute or more and 3600 minutes or less (hereinafter, also referred to as a third step) to the diamond single crystal after the second step.

(First Step)

Figure 2:
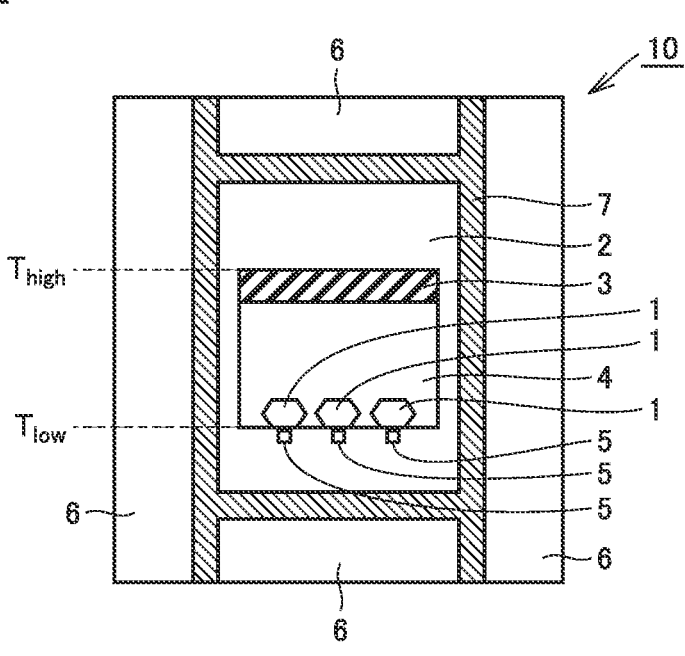
FIG. 2 is a cross-sectional view schematically illustrating an example configuration of a sample chamber used for manufacturing a synthetic single crystal diamond according to an embodiment of the present disclosure.

A diamond single crystal may be produced by a temperature difference process in a sample chamber having a configuration illustrated in FIG. 2, for example.

As illustrated in FIG. 2, in a sample chamber 10 used for the production of a diamond single crystal 1, an insulator 2, a carbon source 3, a solvent metal 4 and seed crystals 5 are placed in a space surrounded by a graphite heater 7, and a pressure medium 6 is placed outside graphite heater 7. The temperature difference process is a synthesis process in which a temperature gradient in the vertical direction is provided inside sample chamber 10, carbon source 3 is placed in a high temperature portion ($T_{high}$) and seed crystals 5 are placed in a low temperature portion ($T_{low}$), the solvent metal 4 is placed between carbon source 3 and seed crystals 5, and diamond single crystal 1 is grown on each of seed crystals 5 by maintaining the temperature equal to or more than a temperature at which solvent metal 4 is dissolved and the pressure equal to or more than a pressure at which the diamond is thermally stable.

As carbon source 3, diamond powder is preferably used. In addition, graphite (black lead) or pyrolytic carbon may also be used. As solvent metal 4, at least one metal selected from iron (Fe), cobalt (Co), nickel (Ni), manganese (Mn) and the like, or an alloy containing these metals may be used.

Carbon source 3 or solvent metal 4 may include a nitrogen source which is added as a simple substance or a mixture of, for example, a nitride such as iron nitride ($Fe_2N$, $Fe_3N$), aluminum nitride (AlN), phosphorus nitride ($P_3N_4$) or silicon nitride ($Si_3N_4$), or an organic nitrogen compound such as melamine or sodium azide. Further, as the nitrogen source, diamond or graphite containing a large amount of nitrogen may be added. Thereby, the synthesized diamond single crystal may contain nitrogen atoms, and the nitrogen atoms in the diamond single crystal exist mainly as isolated substitutional nitrogen atoms.

The content of the nitrogen source in carbon source 3 or solvent metal 4 may be adjusted so that the nitrogen atomic concentration in the synthesized diamond single crystal is 100 ppm or more and 1500 ppm or less. For example, in the carbon source, the content of nitrogen atoms derived from the nitrogen source may be adjusted to 200 ppm or more and 3000 ppm or less. In the case of the solvent metal, for example, when the solvent metal is an alloy composed of iron, cobalt and nickel and the nitrogen source is $Fe_3N$, the content of the nitrogen source may be adjusted to 0.01 mass % or more and 0.2 mass % or less.

Solvent metal 4 may further contain at least one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

(Second Step)

Next, the obtained diamond single crystal is irradiated with one or both of an electron beam and a particle beam with an energy of 100 MGy or more and 1000 MGy or less. As a result, lattice defects are introduced into the diamond single crystal, and thereby vacancies are formed.

If the amount of irradiation energy is less than 100 MGy, the introduction of lattice defects may be insufficient. On the contrary, if the amount of energy is greater than 1000 MGy, excessive vacancies may be formed, which may greatly deteriorate the crystallinity. Therefore, the amount of energy is preferably 100 MGy or more and 1000 MGy or less.

As the particle beam, a neutron beam or a proton beam may be used. The irradiation conditions are not particularly limited as long as the amount of energy applied to the diamond single crystal is 100 MGy or more and 1000 MGy or less. For example, in the case of using an electron beam, the irradiation energy may be 4.6 MeV or more and 4.8 MeV or less, the current may be 2 mA or more and 5 mA or less, and the irradiation time may be 30 hours or more and 45 hours or less.

(Third Step)

Next, a pressure of 5 GPa or more is applied to the diamond single crystal after the second step at a temperature of 2300° C. or more and 2600° C. or less for one minute or more and 3600 minutes or less, thereby obtaining a synthetic single crystal diamond. Thereby, the isolated substitutional nitrogen atoms in the diamond single crystal move through the vacancies and aggregate with each other to form aggregated nitrogen atoms.

When the temperature of the third step is 2300° C. or more, the movement of the nitrogen atoms in the diamond single crystal is promoted and the formation of aggregates each composed of one vacancy and two to four substitutional nitrogen atoms present around the vacancy is promoted. When the temperature of the third step is lower than 2300° C., the formation of these aggregates is difficult. The upper limit of the temperature of the third step is preferably 2600° C. or less from the viewpoint of costs and productivity.

On the contrary, when the diamond single crystal is heated to 2300° C. under normal pressure, the diamond single crystal will be graphitized. As a result of intensive studies, the present inventors newly found that the movement of the nitrogen atoms in the diamond single crystal can be promoted without graphitizing the diamond single crystal by applying the temperature of 2300° C. or more and 2600° C. or less under a high pressure of 5 GPa or more for one minute or more and 3600 minutes or less.

The time during which the temperature of 2300° C. or more and 2600° C. or less is applied to the diamond single crystal under a high pressure of 5 GPa or more is one minute or more and 3600 minutes or less. The time during which the temperature of 2300° C. or more and 2600° C. or less is applied to the diamond single crystal under a high pressure of 5 GPa or more may be adjusted to 60 minutes or more and 360 minutes or less. At this time, the pressure may be adjusted to 5 GPa or more and 20 GPa or less.

The second step and the third step each may be performed once as one cycle, and the cycle may be repeated twice or more, which may promote the aggregation of isolated substitutional nitrogen atoms in the diamond single crystal.

[Addendum 1]

The synthetic single crystal diamond of the present disclosure may contain aggregates each composed of one vacancy and four nitrogen atoms present adjacent to the vacancy (B center (4-nitrogen atom aggregates)).

[Addendum 2]

The synthetic single crystal diamond of the present disclosure may contain aggregates each composed of one vacancy and two nitrogen atoms present adjacent to the vacancy (H3 center (2-nitrogen atom aggregates)).

[Addendum 3]

The synthetic single crystal diamond of the present disclosure may contain aggregates each composed of one vacancy and three nitrogen atoms present adjacent to the vacancy (N3 center (3-nitrogen atom aggregates)).

[Addendum 4]

The synthetic single crystal diamond of the present disclosure may contain the B center and the H3 center.

[Addendum 5]

The synthetic single crystal diamond of the present disclosure may contain the B center and the N3 center.

[Addendum 6]

The synthetic single crystal diamond of the present disclosure may contain the B center, the H3 center and the N3 center.

[Addendum 7]

The synthetic single crystal diamond of the present disclosure preferably does not contain the isolated substitutional nitrogen atoms (C center). In such a case, the hardness and breakage resistance of the synthetic single crystal diamond further improve.

[Addendum 8]

In the infrared absorption spectrum of the synthetic single crystal diamond of the present disclosure, an absorption peak attributed to the C center is preferably not present in the wave number range of $1130\pm2$ cm$^{-1}$. In such a case, the hardness and breakage resistance of the synthetic single crystal diamond further improve. Absorption attributed to the A center or the B center is also present in the wave number range of $1130\pm2$ cm$^{-1}$.

[Addendum 9]

In the infrared absorption spectrum of the synthetic single crystal diamond of the present disclosure, an absorption peak is preferably not present in the wave number range of 1358 cm$^{-1}$ or more and less than 1370 cm$^{-1}$. In such a case, the hardness and breakage resistance of the synthetic single crystal diamond further improve.

[Addendum 10]

The nitrogen atomic concentration in the synthetic single crystal diamond of the present disclosure may be adjusted to 100 ppm or more and 1400 ppm or less.

The nitrogen atomic concentration in the synthetic single crystal diamond of the present disclosure may be adjusted to 100 ppm or more and 1300 ppm or less.

The nitrogen atomic concentration in the synthetic single crystal diamond of the present disclosure may be adjusted to 200 ppm or more and 1500 ppm or less.

The nitrogen atomic concentration in the synthetic single crystal diamond of the present disclosure may be adjusted to 200 ppm or more and 1400 ppm or less.

The nitrogen atomic concentration in the synthetic single crystal diamond of the present disclosure may be adjusted to 200 ppm or more and 1300 ppm or less.

The nitrogen atomic concentration in the synthetic single crystal diamond of the present disclosure may be adjusted to 300 ppm or more and 1500 ppm or less.

The nitrogen atomic concentration in the synthetic single crystal diamond of the present disclosure may be adjusted to 300 ppm or more and 1400 ppm or less.

The nitrogen atomic concentration in the synthetic single crystal diamond of the present disclosure may be adjusted to 300 ppm or more and 1300 ppm or less.

[Addendum 11]

The ratio b/a of the diagonal lines of the Knoop indentation of the synthetic single crystal diamond of the present disclosure may be adjusted to 0 or more and 0.08 or less.

The ratio b/a of the diagonal lines of the Knoop indentation of the synthetic single crystal diamond of the present disclosure may be adjusted to 0 or more and 0.075 or less.

The ratio b/a of the diagonal lines of the Knoop indentation of the synthetic single crystal diamond of the present disclosure may be adjusted to 0 or more and 0.07 or less.

The ratio b/a of the diagonal lines of the Knoop indentation of the synthetic single crystal diamond of the present disclosure may be adjusted to 0 or more and 0.065 or less.

The ratio b/a of the diagonal lines of the Knoop indentation of the synthetic single crystal diamond of the present disclosure may be adjusted to 0 or more and 0.06 or less.

[Addendum 12]

The {001}<100> Knoop hardness of the synthetic single crystal diamond of the present disclosure may be adjusted to 100 GPa or more and 150 GPa or less.

The {001}<100> Knoop hardness of the synthetic single crystal diamond of the present disclosure may be adjusted to 105 GPa or more and 150 GPa or less.

The {001}<100> Knoop hardness of the synthetic single crystal diamond of the present disclosure may be adjusted to 110 GPa or more and 150 GPa or less.

The {001}<100> Knoop hardness of the synthetic single crystal diamond of the present disclosure may be adjusted to 115 GPa or more and 150 GPa or less.

[Addendum 13]

The cracking load of the synthetic single crystal diamond of the present disclosure may be adjusted to 15 N or more and 50 N or less.

The cracking load of the synthetic single crystal diamond of the present disclosure may be adjusted to 17 N or more and 50 N or less.

The cracking load of the synthetic single crystal diamond of the present disclosure may be adjusted to 20 N or more and 50 N or less.

The cracking load of the synthetic single crystal diamond of the present disclosure may be adjusted to 25 N or more and 50 N or less.

The cracking load of the synthetic single crystal diamond of the present disclosure may be adjusted to 30 N or more and 50 N or less.

EXAMPLES

The present disclosure will be described in more detail with reference to examples. However, the scope of the present disclosure is not limited to these examples.

[Production of Synthetic Single Crystal Diamond]

<Sample 2 and Sample 4 to Sample 8>

(First Step)

Diamond single crystals are synthesized in a sample chamber having the configuration illustrated in FIG. 2 by the temperature difference process using a solvent metal.

As the solvent metal, an alloy composed of iron, cobalt and nickel is prepared, and to the solvent metal, iron nitride (Fe$_3$N) powder is added as a nitrogen source. The concentrations of the iron nitride in the solvent metal are shown in the column "concentration of iron nitride in solvent metal (mass %)" of "production conditions" in Table 1. For example, in Sample 2, the concentration of the iron nitride in the solvent metal is 0.02 mass %.

Diamond powder is used as the carbon source, and approximately 0.5 mg of diamond single crystal is used as the seed crystal. The temperature in the sample chamber is adjusted by using a heater so that a temperature difference of several tens of degrees is created between the high temperature portion where the carbon source is placed and the low temperature portion where the seed crystal is placed. In addition, an ultrahigh pressure generator is used to control the pressure to 5.5 GPa and the temperature of the low temperature portion in the range of 1370° C.±10° C. (1360° C. to 1380° C.), and the controlled pressure and temperature are kept for 60 hours, and thereby the diamond single crystals are synthesized on the seed crystal.

(Second Step)

Next, the obtained diamond single crystals are irradiated with an electron beam. The irradiation condition is set to include an irradiation energy of 4.6 MeV, a current of 2 mA, and an irradiation time of 30 hours. This irradiation condition is the same as the irradiation condition for applying an energy of 100 MGy to a diamond single crystal.

(Third Step)

Next, temperatures shown in the column "third step (60 minutes)" of "production conditions" in Table 1 are applied to the diamond single crystals that have been irradiated with an electron beam under a high pressure of 6 GPa or more (expressed as "high pressure" in Table 1) for 60 minutes, thereby obtaining synthetic single crystal diamonds. For example, for sample 2, a high pressure of 6 GPa or more (high pressure) and a temperature of 2350° C. are applied to the diamond single crystal for 60 minutes.

<Sample 1>

For sample 1, a diamond single crystal is synthesized by the same first step as for sample 2. For sample 1, the second step and the third step are not performed.

<Sample 3>

For sample 3, a diamond single crystal is synthesized by the same first step as for sample 4. For sample 1, the second step and the third step are not performed.

TABLE 1

| | Production conditions | | |
|---|---|---|---|
| Sample No. | Concentration of iron nitride in solvent metal (mass %) | Irradiation with electron beam (100 MGy) | Third step (60 minutes) |
| 1 | 0.02 | Non-operated | Non-operated |
| 2 | 0.02 | Operated | High pressure 2350° C. |
| 3 | 0.08 | Non-operated | Non-operated |
| 4 | 0.08 | Operated | High pressure 2350° C. |
| 5 | 0.08 | Operated | High pressure 2450° C. |
| 6 | 0.08 | Operated | High pressure 2600° C. |
| 7 | 0.1 | Operated | High pressure 2450° C. |
| 8 | 0.15 | Operated | High pressure 2450° C. |

<Evaluation>

The synthetic single crystal diamonds of sample 2 and sample 4 to sample 8 and the diamond single crystals of sample 1 and sample 3 (hereinafter, also referred to as "synthetic single crystal diamond/diamond single crystal") were subject to measurement of nitrogen atomic concentration, measurement of fluorescent spectrum, infrared spectroscopy, measurement of {001}<100> Knoop hardness, measurement of ratio b/a of the diagonal lines of the Knoop indentation, and breaking strength test.

(Determination of Nitrogen Atomic Concentration)

The nitrogen atomic concentration in the synthetic single crystal diamond/diamond single crystal of each sample is determined by SIMS analysis. The results are shown in the column "nitrogen atomic concentration (ppm)" of "synthetic single crystal diamond/diamond single crystal" in Table 2.

(Fluorescent Spectrum)

The surface of the synthetic single crystal diamond/diamond single crystal of each sample is mirror-polished and then irradiated with excitation light having the wavelength of 325 nm to measure the fluorescent spectrum.

In the fluorescent spectrum, the presence or absence of a luminescence peak in the ranges of the following (a) to (d) is confirmed.

(a) In the fluorescent wavelength range of 415±2 nm (b) In the fluorescent wavelength range of 420 nm or more and 470 nm or less (c) In the fluorescent wavelength range of 503±2 nm (d) In the fluorescent wavelength range of 510 nm or more and 530 nm or less The results are shown in the columns "luminescence peak in range of 415±2 nm", "420 to 470 nm subband", "luminescence peak in range of 503±2 nm", and "510 to 530 nm subband" of "fluorescent spectrum" of "synthetic single crystal diamond/diamond single crystal" in Table 2.

When a luminescence peak is present in one or both of (a) in the fluorescent wavelength range of 415±2 nm and (b) in the fluorescent wavelength range of 420 nm or more and 470 nm or less, the N3 center is regarded as being "present", and, when no luminescence peak is present in both of the ranges, the N3 center is regarded as being "absent". The results are shown in the column "N3 center" of "fluorescent spectrum" of "synthetic single crystal diamond/diamond single crystal" in Table 2.

When a luminescence peak is present in one or both of (c) in the fluorescent wavelength range of 503±2 nm and (d) in the fluorescent wavelength range of 510 nm or more and 530 nm or less, the H3 center is regarded as being "present", and, when no luminescence peak is present in both of the ranges, the H3 center is regarded as being "absent". The results are shown in the column "H3 center" of "fluorescent spectrum" of "synthetic single crystal diamond/diamond single crystal" in Table 2.

(Infrared Spectroscopy)

After machining the synthetic single crystal diamond/diamond single crystal of each sample into a plate with a thickness of approximately 1 mm and polishing two surfaces that transmit light to mirror surfaces, the absorbance is measured in the infrared region with a Fourier transform infrared spectroscopy to prepare an infrared absorption spectrum.

When an absorption peak except absorption attributed to other centers is present at the wave number of $1282\pm2$ cm$^{-1}$ in the infrared absorption spectrum, the A center is regarded as being "present", and, when no absorption peak is present at the wave number of $1282\pm2$ cm$^{-1}$, the A center is regarded as being "absent". The results are shown in the column "A center" of "infrared absorption spectrum" of "synthetic single crystal diamond/diamond single crystal" in Table 2.

When an absorption peak except absorption attributed to other centers is present at the wave number of $1175\pm2$ cm$^{-1}$ in the infrared absorption spectrum, the B center is regarded as being "present", and, when no absorption peak is present at the wave number of $1175\pm2$ cm$^{-1}$, the B center is regarded as being "absent". The results are shown in the column "B center" of "infrared absorption spectrum" of "synthetic single crystal diamond/diamond single crystal" in Table 2.

When an absorption peak except absorption attributed to other centers is present at the wave number of $1130\pm2$ cm$^{-1}$ in the infrared absorption spectrum, the C center is regarded as being "present", and, when no absorption peak is present at the wave number of $1130\pm2$ cm$^{-1}$, the C center is regarded as being "absent". The results are shown in the column "C center" of "infrared absorption spectrum" of "synthetic single crystal diamond/diamond single crystal" in Table 2.

When an absorption peak except absorption attributed to other centers is present at the wave number of 1370 to 1385 cm$^{-1}$ in the infrared absorption spectrum, the B' center (platelets) is regarded as being "present", and, when no absorption peak is present at the wave number of 1370 to 1385 cm$^{-1}$, the B' center (platelets) is regarded as being "absent". The results are shown in the column "B' center/ platelets" of "infrared absorption spectrum" of "synthetic single crystal diamond/diamond single crystal" in Table 2.

The synthetic single crystal diamond containing the B' center (platelets) shows an absorption peak at the wave number of 1358 cm$^{-1}$ or more and 1385 cm$^{-1}$ or less in the infrared absorption spectrum. However, when an absorption peak is present in the range smaller than the wave number of 1370 cm$^{-1}$ (the wave number of 1358 cm$^{-1}$ or more and less than 1370 cm$^{-1}$), the B' center (platelets) aggregate in the crystal is too large and acts as a starting point of breaking, which is not preferable. For samples 1 to 8, no absorption peak is present at the wave number of 1358 cm$^{-1}$ or more and less than 1370 cm$^{-1}$.

As the reference values, the value of the absorbance at the wave number of 1282 cm$^{-1}$ (A center), the value of the absorbance at the wave number of 1175 cm$^{-1}$ (B center), the value of the absorbance at the wave number of 1130 cm$^{-1}$ (C center), the value of the absorbance of a peak at the wave number of 1370 cm$^{-1}$ or more and 1385 cm$^{-1}$ or less, and the value of the absorbance of a peak at the wave number of 1358 cm$^{-1}$ or more and 1370 cm$^{-1}$ or less when the absorbance at the wave number of 2160 cm$^{-1}$, which is absorption attributed to the phonon of diamond taken as 1 are calculated. The results are shown in the columns "I (1282)/I (2160)", "I (1175)/I (2160)", "I (1130)/I (2160)", "I (1370-1385)/I (2160)", and "I (1358-1370)/I (2160)" of "infrared absorption spectrum" of "synthetic single crystal diamond/ diamond single crystal" in Table 2.

Regarding I (1175)/I (2160), the value of I (1175)/I (2160) is larger in sample 2 where the B center is "present" than in sample 3 where the B center is "absent". This is because sample 3 contains much nitrogen of the C center and thus absorption at the wave number of 1175 cm$^{-1}$ derived from the shoulder of the absorption spectrum of this C center is strong, and this does not indicate that sample 3 contains the B center.

Regarding I (1130)/I (2160), the value of I (1130)/I (2160) is larger in sample 4 to sample 8 where the C center is "absent" than in sample 1 where the C center is "present". This is because sample 4 to sample 8 contain much nitrogen of the A center and the B center and thus absorption at the wave number of 1130 cm$^{-1}$ derived from the shoulder of the absorption spectrum of these A center and B center is strong, and this does not indicate that sample 4 to sample 8 contain the C center.

(Measurement of Knoop Hardness)

An indentation is made with a load of 4.9 N in the <100> direction in the {001} plane of the synthetic single crystal diamond/diamond single crystal of each sample. The length "a" ($\mu$m) of the long diagonal line of the obtained Knoop indentation is measured, and the Knoop hardness (HK) is calculated by the following expression A. A specific measurement method is described in Embodiment 1 and thus will not be repeatedly described. The results are shown in the column "{001}<100> Knoop hardness" of "synthetic single crystal diamond/diamond single crystal" in Table 2.

$$HK=14229\times4.9/a^2 \qquad \text{Expression A}$$

(Measurement of Knoop Indentation (b/a))

For the Knoop indentation obtained by the measurement of the Knoop hardness, the length a of the long diagonal line and the length b of the short diagonal line are measured, and the ratio b/a is calculated. The results are shown in the column "b/a {001}<110>" of "synthetic single crystal diamond/diamond single crystal" in Table 2. As the value of the ratio b/a becomes smaller, the elastic deformability becomes larger.

(Breaking Strength Test)

A spherical diamond indenter having R of 50 $\mu$m is prepared, a load is applied to the synthetic single crystal diamond/diamond single crystal of each sample at a loading speed of 100 N/min at room temperature (23° C.), and the load at the moment when a crack occurred in the sample (cracking load) is measured. A specific measurement method is described in Embodiment 1 and thus will not be repeatedly described. The larger the cracking load, the higher the strength of the sample and the better the breakage resistance. The results are shown in the column "cracking load" of "synthetic single crystal diamond/diamond single crystal" in Table 2.

TABLE 2

| | | | | | | | | | | |
|---|---|---|---|---|---|---|---|---|---|---|
| Synthetic single crystal diamond/diamond single crystal | | | | | | | | | | |
| | Fluorescent spectrum | | | | | | | | | |
| | Luminescence | 420 to | | Luminescence | 510 to | | Infrared absorption spectrum | | | |
| Sample No. | peak in range of 415 ± 2 nm | 470 nm subband | N3 center | peak in range of 503 ± 2 nm | 530 nm subband | H3 center | $I_{(1282)}/I_{(2160)}$ | A center | $I_{(1175)}/I_{(2160)}$ | B center |
| 1 | Absent | Absent | Absent | Absent | Absent | Absent | 0.2 | Absent | 0.4 | Absent |
| 2 | Present | Present | Present | Present | Present | Present | 0.9 | Present | 0.6 | Present |
| 3 | Absent | Absent | Absent | Absent | Absent | Absent | 0.6 | Absent | 1.3 | Absent |
| 4 | Present | Present | Present | Present | Present | Present | 1.8 | Present | 2 | Present |
| 5 | Present | Present | Present | Absent | Absent | Absent | 2.4 | Present | 1.8 | Present |
| 6 | Present | Present | Present | Absent | Absent | Absent | 2.5 | Present | 1.8 | Present |
| 7 | Present | Present | Present | Absent | Absent | Absent | 2.7 | Present | 1.6 | Present |
| 8 | Present | Present | Present | Absent | Absent | Absent | 3.7 | Present | 2 | Present |

TABLE 2-continued

| | | | | | | | | {001}<100> | | |
| | | | Synthetic single crystal diamond/diamond single crystal | | | | | | | |
| | | Infrared absorption spectrum | | | | Nitrogen atomic | Knoop | b/a | Cracking |
| Sample No. | $I_{(1130)}/I_{(2160)}$ | C center | $I_{(1370-1385)}/I_{(2160)}$ | $I_{(1358-1370)}/I_{(2160)}$ | B' center/ platelets | concentration (ppm) | hardness (GPa) | {001}<110> | load (N) |
|---|---|---|---|---|---|---|---|---|---|
| 1 | 0.7 | Present | 0 | 0 | Absent | 250 | 90 | 0.082 | 11 |
| 2 | 0.3 | Absent | 0.001 | 0 | Present | 250 | 102 | 0.075 | 17 |
| 3 | 2.5 | Present | 0 | 0 | Absent | 800 | 85 | 0.085 | 14 |
| 4 | 0.9 | Absent | 0.005 | 0 | Present | 800 | 118 | 0.072 | 20 |
| 5 | 1.2 | Absent | 0.02 | 0 | Present | 800 | 125 | 0.063 | 23 |
| 6 | 1.2 | Absent | 0.08 | 0 | Present | 800 | 136 | 0.057 | 29 |
| 7 | 1.1 | Absent | 0.1 | 0 | Present | 1000 | 130 | 0.055 | 32 |
| 8 | 1.3 | Absent | 0.15 | 0 | Present | 1500 | 132 | 0.052 | 32 |

<Consideration>

Sample 2 and sample 4 to sample 8 correspond to examples. Sample 1 and sample 3 correspond to comparative examples. It is confirmed that sample 2 and sample 4 to sample 8 (examples) have high hardness, large elastic deformability and excellent breakage resistance compared with sample 1 and sample 3 (comparative examples).

The embodiment and the examples of the present disclosure have been described as described above, and originally, appropriate combinations or various modifications of the configurations of individual embodiments and Examples described above are also planned.

It should be understood that the embodiments and examples disclosed herein have been presented for the purpose of illustration and description but not limited in all aspects. It is intended that the scope of the present invention is defined by the scope of the claims, rather than the embodiments and examples described above, and encompasses all modifications within the scope and meaning equivalent to the scope of the claims.

REFERENCE SIGNS LIST

1: diamond single crystal; 2: insulator; 3: carbon source; 4: solvent metal; 5: seed crystal; 6: pressure medium; 7: graphite heater; 10: sample chamber

The invention claimed is:

1. A synthetic single crystal diamond comprising 100 ppm or more and 1500 ppm or less of nitrogen atoms,
    wherein the synthetic single crystal diamond contains aggregates each composed of one vacancy and two to four nitrogen atoms present adjacent to the vacancy,
    wherein a ratio b/a of a length b of a short diagonal line to a length a of a long diagonal line of diagonal lines of a Knoop indentation in a <110> direction in a {001} plane of the synthetic single crystal diamond is 0.08 or less, and
    wherein the Knoop indentation is formed by measuring Knoop hardness in the <100> direction in the {001} plane of the synthetic single crystal diamond according to JIS Z 2251:2009 under conditions of a temperature of 23° C.±5° C. and a test load of 4.9 N,
    wherein the synthetic single crystal diamond has a Knoop hardness of greater than 130 GPa in a <100> direction in a {001} plane.

2. The synthetic single crystal diamond according to claim 1, wherein, in an infrared absorption spectrum of the synthetic single crystal diamond, an absorption peak is present in the wave number range of 1175±2 cm⁻¹.

3. The synthetic single crystal diamond according to claim 1, wherein, in a fluorescent spectrum of the synthetic single crystal diamond, a luminescence peak is present in one or both of the fluorescence wavelength range of 503±2 nm and the fluorescence wavelength range of 510 nm or more and 530 nm or less.

4. The synthetic single crystal diamond according to claim 1, wherein, in a fluorescent spectrum of the synthetic single crystal diamond, a luminescence peak is present in one or both of the fluorescence wavelength range of 415±2 nm and the fluorescence wavelength range of 420 nm or more and 470 nm or less.

5. The synthetic single crystal diamond according to claim 1, wherein, in an infrared absorption spectrum of the synthetic single crystal diamond, an absorption peak is present in the wave number range of 1282±2 cm⁻¹.

6. The synthetic single crystal diamond according to claim 1, wherein, in an infrared absorption spectrum of the synthetic single crystal diamond, an absorption peak is present in the wave number range of 1370 cm⁻¹ or more and 1385 cm⁻¹ or less.

7. The synthetic single crystal diamond according to claim 1, wherein the synthetic single crystal diamond has a cracking load of 17 N or more in a breaking strength test in which a spherical diamond indenter having a tip radius of 50 μm is pressed against a surface of the synthetic single crystal diamond at a loading speed of 100 N/min.

8. A method for manufacturing the synthetic single crystal diamond according to claim 1, the method comprising:
    a first step of synthesizing a diamond single crystal containing nitrogen atoms at a concentration of 100 ppm or more and 1500 ppm or less based on atom numbers by a temperature difference process using a solvent metal;
    a second step of irradiating the diamond single crystal with one or both of an electron beam and a particle beam with an energy of 100 MGy or more and 1000 MGy or less; and
    a third step of obtaining a synthetic single crystal diamond by applying a pressure of 5 GPa or more and a temperature of 2300° C. or more and 2600° C. or less for one minute or more and 3600 minutes or less to the diamond single crystal after the second step.

* * * * *